(12) United States Patent
Kataoka

(10) Patent No.: US 7,321,182 B2
(45) Date of Patent: Jan. 22, 2008

(54) OSCILLATORY-WAVE ACTUATOR AND METHOD FOR DRIVING OSCILLATORY-WAVE ACTUATOR

(75) Inventor: Kenichi Kataoka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/441,909

(22) Filed: May 26, 2006

(65) Prior Publication Data

US 2006/0273689 A1    Dec. 7, 2006

(30) Foreign Application Priority Data

Jun. 1, 2005    (JP)    ............................ 2005-161799

(51) Int. Cl.
*H02N 1/04*    (2006.01)
(52) U.S. Cl. ................................. 310/323.02
(58) Field of Classification Search ........... 310/323.02, 310/317, 328, 323, 316.02
See application file for complete search history.

(56) References Cited

U.S. PATENT DOCUMENTS

| | | | |
|---|---|---|---|
| 4,510,411 A * | 4/1985 | Hakamata et al. ..... | 310/316.02 |
| 4,727,276 A * | 2/1988 | Izukawa et al. ....... | 310/316.02 |
| 4,749,896 A * | 6/1988 | Suzuki et al. .......... | 310/316.02 |
| 5,001,404 A * | 3/1991 | Kataoka .................. | 318/116 |
| 5,134,348 A * | 7/1992 | Izukawa et al. ........ | 318/116 |
| 5,191,688 A * | 3/1993 | Takizawa et al. ....... | 29/25.35 |
| 5,233,274 A * | 8/1993 | Honda et al. .......... | 318/116 |
| 5,606,390 A * | 2/1997 | Arai et al. ............. | 395/51 |
| 5,760,527 A * | 6/1998 | Ashizawa .............. | 310/317 |
| 5,920,144 A * | 7/1999 | Atsuta .................. | 310/316.02 |
| 5,932,952 A * | 8/1999 | Takagi ................. | 310/323.02 |
| 5,936,328 A * | 8/1999 | Takano et al. ........ | 310/323.02 |
| 6,072,266 A * | 6/2000 | Tomikawa ............ | 310/323.02 |
| 6,084,363 A * | 7/2000 | Mizumoto ............ | 318/116 |
| 6,331,747 B2 * | 12/2001 | Yoshida et al. ...... | 310/313 R |
| 6,744,227 B2 * | 6/2004 | Kataoka ............... | 318/114 |
| 6,765,335 B2 * | 7/2004 | Wischnewskiy ..... | 310/323.02 |
| 6,952,073 B2 * | 10/2005 | Yamamoto ........... | 310/323.06 |

(Continued)

FOREIGN PATENT DOCUMENTS

JP    05-088074 A    4/1993

(Continued)

OTHER PUBLICATIONS

Arthur Ballato et al., Systematic Design of Stacked-Crystal Filters by Microwave Network Methods, Jan. 1974, IEEE Transactions on Microwave Theory and Techniques, vol. MTT-22, No. 1, pp. 14-25.*

*Primary Examiner*—Lincoln Donovan
*Assistant Examiner*—Christopher Uhlir
(74) *Attorney, Agent, or Firm*—Canon USA Inc IP Division

(57) ABSTRACT

An oscillatory-wave actuator is provided capable of simplifying the structure of a driving circuit. Push-up vibration is formed in an oscillating body including three piezoelectrics and an elastic body by applying an AC voltage to the first piezoelectric. The second piezoelectric outputs a vibration-detecting voltage according to the amplitude of the push-up vibration, and the third piezoelectric receives the vibration-detecting voltage and generates torsional vibration in the oscillating body. As a result, a traveling oscillatory wave can be formed in the elastic body by use of a single-phase driving voltage (AC voltage).

5 Claims, 5 Drawing Sheets

U.S. PATENT DOCUMENTS

| | | | |
|---|---|---|---|
| 7,061,156 B2 * | 6/2006 | Kataoka | 310/316.02 |
| 7,119,475 B2 * | 10/2006 | Matsuzaki et al. | 310/316.01 |
| 7,129,618 B2 * | 10/2006 | Fujimoto et al. | 310/316.01 |
| 2003/0184190 A1 * | 10/2003 | Kataoka | 310/317 |
| 2004/0051421 A1 * | 3/2004 | Montuschi et al. | 310/317 |
| 2004/0256951 A1 * | 12/2004 | Fujimoto et al. | 310/317 |
| 2005/0029905 A1 * | 2/2005 | Dal et al. | 310/317 |

FOREIGN PATENT DOCUMENTS

| | | |
|---|---|---|
| JP | 05-284764-4 | 10/1993 |

* cited by examiner

OSCILLATORY-WAVE ACTUATOR AND METHOD FOR DRIVING OSCILLATORY-WAVE ACTUATOR

BACKGROUND OF THE INVENTION

1. Field of the Invention

The present invention relates to actuators that are made to actuate by using ultrasonic vibration and methods for driving the same.

2. Description of the Related Art

Oscillatory-wave actuators such as ultrasonic motors (USMs) form a plurality of standing waves whose positions are shifted according to their time of generation in elastic bodies, and drive movable bodies that are in contact with the elastic bodies according to traveling waves formed by synthesizing the plurality of standing waves. In general, such oscillatory-wave actuators are driven by applying two or more alternating (AC) voltages whose phases are shifted relative to each other. Japanese Patent Publication No. 05-88074 discloses a technology of applying a single-phase voltage to another voltage that has been phase shifted by phase retardation by use of an inductor when an oscillatory-wave actuator is driven by a single-phase high-frequency AC-power circuit.

Also, Japanese Patent Laid-Open No. 05-284764 discloses a technology for enabling a reduction in the size of an oscillatory-wave actuator by applying AC voltages boosted by a piezoelectric transformer. However, the technology disclosed in Japanese Patent Publication No. 05-88074 requires inductor elements in addition to an oscillator.

Moreover, mechanical resonance and electrical resonance need to be matched with each other. Moreover, the technology disclosed in Japanese Patent Laid-Open No. 05-284764 requires an oscillator for the piezoelectric transformer in addition to the oscillator for the USM. Also, the resonance frequency of the piezoelectric transformer and that of the oscillatory-wave actuator need to be matched.

It would be desirable to provide an oscillatory-wave actuator having a simplified design which would require less components. For instance, it would be desirable to provide an oscillatory-wave actuator that forms a traveling wave in the elastic body by use of a single-phase driving voltage without requiring a driving circuit generating multi-phase AC voltages.

SUMMARY OF THE INVENTION

The present invention provides a simplified structure of an oscillatory-wave actuator that forms a traveling wave by forming a plurality of standing waves in an elastic body and by synthesizing the plurality of standing waves. That is to say, a traveling oscillating wave can be formed in the elastic body by means of a single-phase driving voltage without requiring a driving circuit generating multi-phase AC voltages.

According to an aspect of the present invention, an oscillatory-wave actuator is provided which is configured to form a plurality of standing waves having positions which are shifted according to their time of generation, wherein a traveling wave is formed by synthesis of the plurality of standing waves. Here, the actuator includes an elastic body configured to generate standing waves; a movable body in contact with the elastic body, wherein the movable body is driven according to the traveling wave; a first electromechanical transducer configured to form a first standing wave in response to a supplied voltage; a second electromechanical transducer configured to output a vibration-detecting voltage in response to vibration from the first standing wave; and a third electromechanical transducer configured to form a second standing wave in response to the vibration-detecting voltage that is input into the third electromechanical transducer.

According to an aspect of the present invention, the oscillatory-wave actuator may further include a phase-adjusting element disposed in series with or in parallel with the third electromechanical transducer, wherein the phase-adjusting element is configured to adjust the phase of the vibration-detecting voltage. And according to another aspect of the present invention, the vibration-detecting voltage may further include a plurality of vibration-detecting voltages, wherein the second electromechanical transducer outputs vibration-detecting voltages having different polarities. According to yet another aspect of the present invention, the vibration-detecting voltage may further include a plurality of vibration-detecting voltages, wherein vibration-detecting voltages having different polarities are input into the third electromechanical transducer.

Moreover, according to another aspect of the present invention, the oscillatory-wave actuator may further include a selection unit; and wherein the second electromechanical transducer include first and second electromechanical transducing sets connected in parallel with each other, and the third electromechanical transducer include third and fourth electromechanical transducing sets connected in parallel with each other; and wherein the selection unit selects either a combination of the first electromechanical transducing set and the third electromechanical transducing set or a combination of the second electromechanical transducing set and the fourth electromechanical transducing set, and connects the selected one of the combinations with the third electromechanical transducer.

Furthermore, according to another aspect of the present invention, the second electromechanical transducer is connected with the third electromechanical transducer to generate voltage. Additionally, according to another aspect of the present invention, a method is provided for driving an oscillatory-wave actuator. Here, the actuator includes an elastic body in contact with a movable body, the actuator is configured to form a plurality of standing waves having positions which are shifted according to their time of generation in the elastic body, and the actuator is further configured to drive the movable body according to a traveling wave formed by synthesis of the plurality of standing waves. The actuator further includes first, second and third electromechanical transducers. The method includes supplying the first electromechanical transducer with voltage to form a first standing wave; outputting a vibration-detecting voltage from the second electromechanical transducer in response to vibration from the first standing wave; and inputting the vibration-detecting voltage into the third electromechanical transducer to form a second standing wave.

Further features and aspects of the present invention will become apparent from the following description of exemplary embodiments of the present invention with reference to the attached drawings.

DESCRIPTION OF THE EMBODIMENTS

The following description of the numerous embodiments of the present invention is merely illustrative in nature and is in no way intended to limit the invention, its application, or uses. The exemplary embodiments of the present invention will now be herein described in detail with reference to the drawings.

First Exemplary Embodiment

Figure 1:
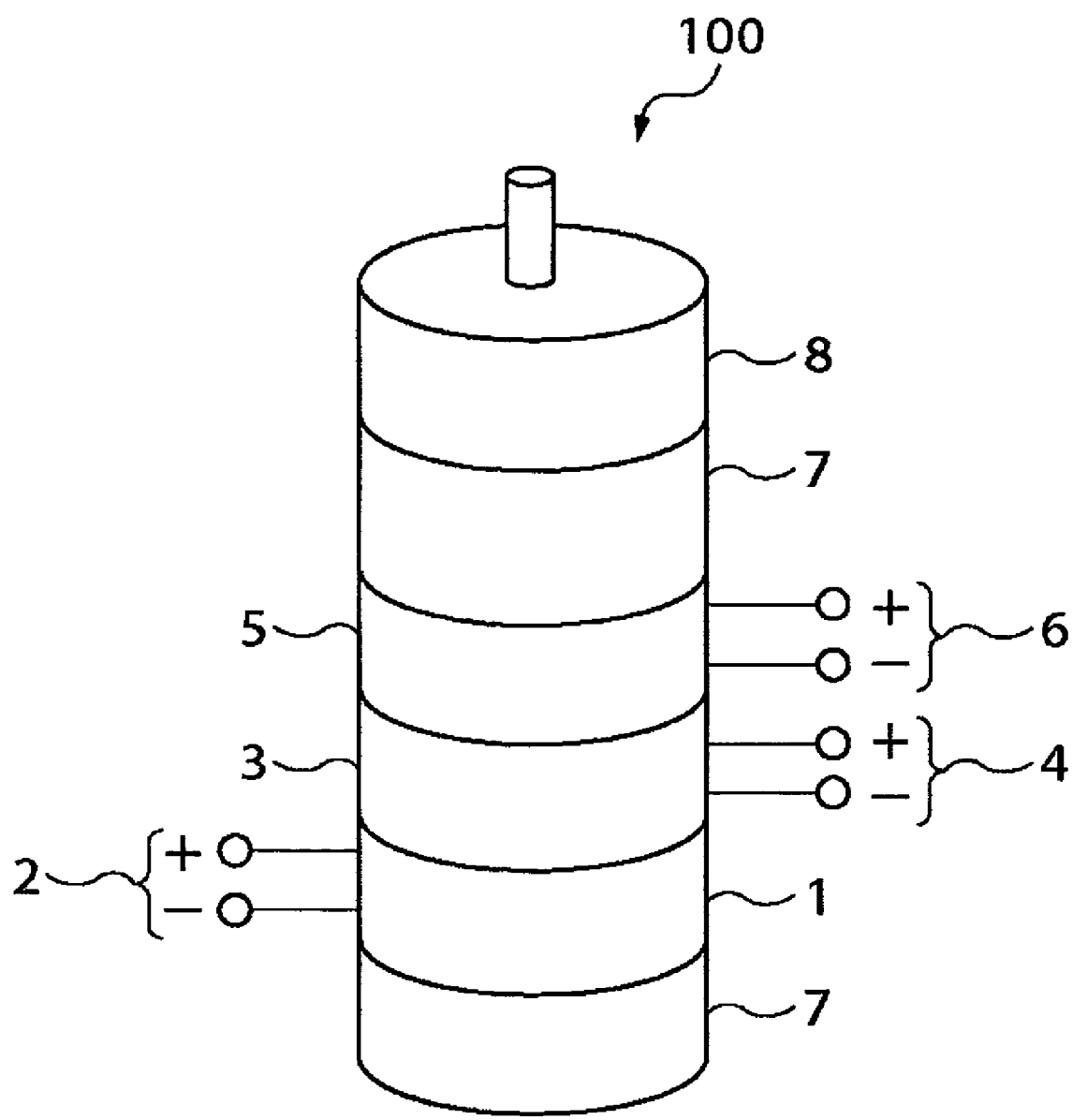
FIG. 1 illustrates an exemplary structure of an oscillatory-wave actuator according to a first exemplary embodiment of the present invention.
Figure 2:
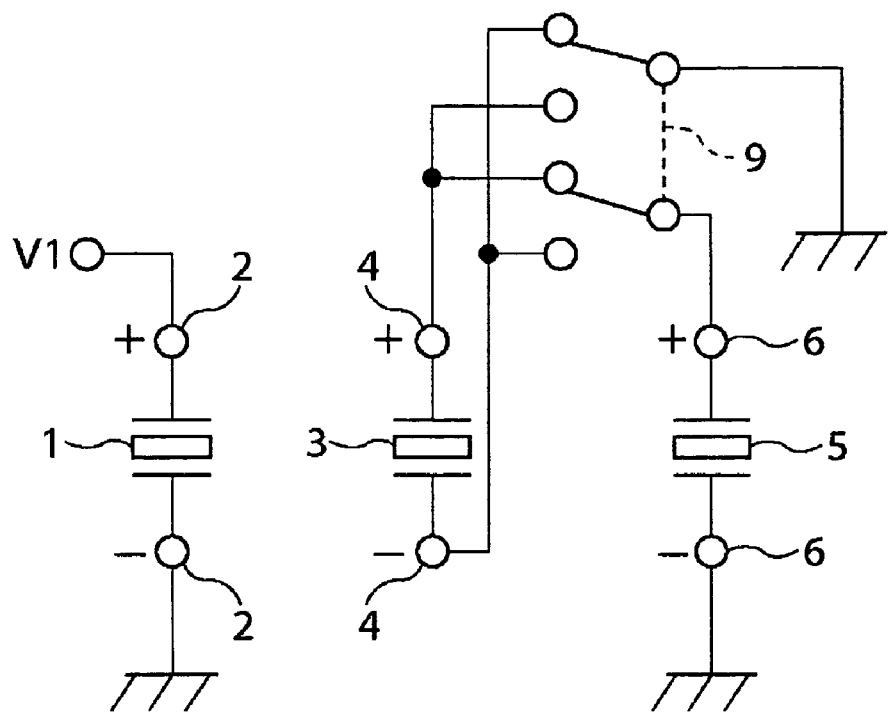
FIG. 2 illustrates an exemplary driving circuit of the oscillatory-wave actuator shown in FIG. 1.

FIG. 1 illustrates an exemplary structure of an oscillatory-wave actuator according to a first exemplary embodiment of the present invention. The oscillatory-wave actuator 100 includes piezoelectrics 1, 3, and 5; electrodes 2, 4, and 6 provided for the piezoelectrics 1, 3, and 5, respectively; elastic bodies 7 retaining the piezoelectrics 1, 3, and 5 therebetween; and a movable body (rotor) 8 pressed into contact with the upper elastic body 7 by a pressurizing mechanism (not shown). Signs marked on the electrodes 2, 4, and 6 represent polarities of polarization. FIG. 2 illustrates an exemplary driving circuit of the oscillatory-wave actuator 100 shown in FIG. 1.

Here, a switch 9 connects the positive terminal or the negative terminal of the electrode 4 provided for the piezoelectric 3 with the positive terminal of the electrode 6 provided for the piezoelectric 5. In order to rotate the movable body 8 shown in FIG. 1, generation of relative motion in a rotational direction between the upper elastic body 7 and the movable body 8, the respective inner and outer surfaces thereof being in contact, is required.

In this exemplary embodiment, vibration is generated in the elastic bodies 7 such that the force is transmitted to the movable body 8. More specifically, vibration created by synthesizing push-up vibration in a normal direction and torsional vibration in a tangential direction is generated in a surface of the upper elastic body 7 with which a surface of the movable body 8 is in contact such that the relative motion in the rotational direction between the contact surfaces of the upper elastic body 7 and the movable body 8 is generated. Furthermore, the phase of the vibration in the normal direction and that of the vibration in the tangential direction are shifted with respect to each other such that the force is efficiently transmitted to the movable body 8. Exemplary operations of the oscillatory-wave actuator 100 will now be described with reference to FIGS. 1 and 2.

In the electrode 2 provided for the piezoelectric 1, the negative terminal is connected to the ground potential, and an AC voltage V1 is applied to the positive terminal. The piezoelectric 1 is a laminated piezoelectric element for generating push-up vibration in the elastic bodies 7. The push-up vibration is generated in a oscillating body formed of the piezoelectrics 1, 3, 5, and the elastic bodies 7 by setting the frequency of the AC voltage V1 to a value close to and higher than a resonant frequency of the oscillating body.

Figure 3:
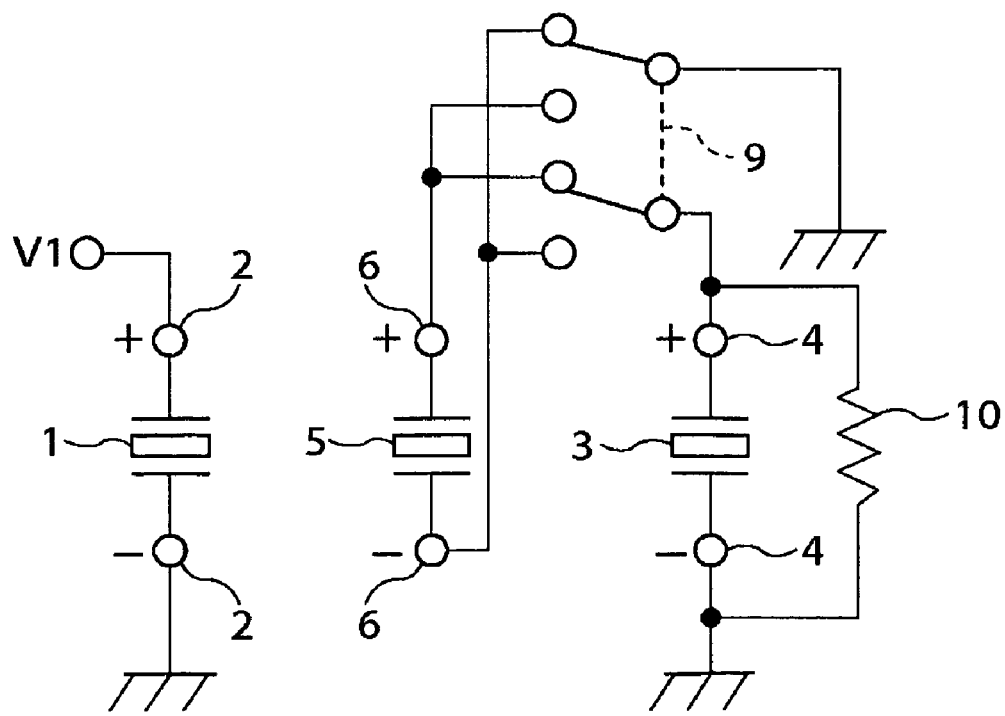
FIG. 3 illustrates a modification of the driving circuit shown in FIG. 2.

The piezoelectric 3 is a laminated piezoelectric element disposed at a position remote from a node of the push-up vibration, and is distorted by the push-up vibration. Electrical charge proportional to this distortion is stored in the piezoelectric 3. When electrical charge up to the equivalent capacity of the piezoelectric 3 is stored, the piezoelectric 3 outputs a vibration-detecting voltage. The vibration-detecting voltage of the piezoelectric 3 according to the amplitude of the push-up vibration is output between the positive terminal and the negative terminal of the electrode 4, and only the vibration-detecting voltage is input to the electrode 4. The phase of the vibration-detecting voltage is shifted from that of the AC voltage V1, but changes from 180° toward 90° as the frequency of the AC voltage V1 approaches the resonant frequency of the oscillating body. The vibration-detecting voltage is applied to the positive terminal of the electrode 6 of the piezoelectric 5, and generates the torsional vibration in the oscillating body. At this time, the switch 9 switches the polarity of the vibration-detecting voltage that is output to the electrode 6 by connecting either the positive terminal or the negative terminal of the electrode 4 with the ground potential. As a result, the polarity of the phase difference between the push-up vibration and the torsional vibration generated in the oscillating body is switched by the switch 9, and the rotational direction of the movable body 8 is switched. FIG. 3 illustrates a modification of the driving circuit shown in FIG. 2.

The driving circuit shown in FIG. 2 switches the rotational direction of the movable body 8 by switching the polarity of the vibration-detecting voltage of the piezoelectric 3 and by applying the vibration-detecting voltage to the piezoelectric 5. In contrast, the driving circuit shown in FIG. 3 switches the rotational direction of the movable body 8 by switching the terminals of the piezoelectric 5, to which the vibration-detecting voltage of the piezoelectric 3 is applied, by using the switch 9.

Moreover, in FIG. 3, the positive terminal of the electrode 4 is connected to the ground potential by resistance 10 such that the phase of the vibration-detecting voltage of the piezoelectric 3 is shifted with respect to that of actual vibration. Thus, the phase of the vibration-detecting voltage of the piezoelectric 3 can be adjusted, and the phase difference between the push-up vibration and the torsional vibration can be optimized. Herein, the resistance 10 and the piezoelectric 3 are connected in parallel such that the phase of the vibration-detecting voltage of the piezoelectric 3 can be adjusted, but a resistance or an inductance disposed in parallel with or in series with the piezoelectric 3 can also adjust the phase of the vibration-detecting voltage of the piezoelectric 3. Thus, the driving circuit is applicable when the driving frequency of the AC voltage V1 is lower than the resonant frequency of the oscillating body or when a phase difference other than 90° is required as in a case of a three-phase drive and the like.

As described above, according to this exemplary embodiment, the AC voltage V1 is applied to the piezoelectric 1 such that the push-up vibration is generated in the oscillating body formed of the piezoelectrics 1, 3, 5, and the elastic bodies 7; and the piezoelectric 3 outputs the vibration-detecting voltage in response to the amplitude of the push-up vibration. Then, the vibration-detecting voltage is input to the piezoelectric 5 such that torsional vibration is generated in the oscillating body. As a result, a traveling oscillating wave is formed in the elastic bodies by action of a single-phase driving voltage without requiring a driving circuit that generates polyphase AC voltages, resulting in a simplified structure of the driving circuit.

Moreover, the phase of the vibration-detecting voltage output from the piezoelectric 3 approaches the phase of the AC voltage V1 (90°) as the frequency of the AC voltage V1 approaches the resonant frequency of the oscillating body. Thus, the phase characteristic is stabilized without requiring an additional oscillator or electrical matching.

Second Exemplary Embodiment

Figure 4:
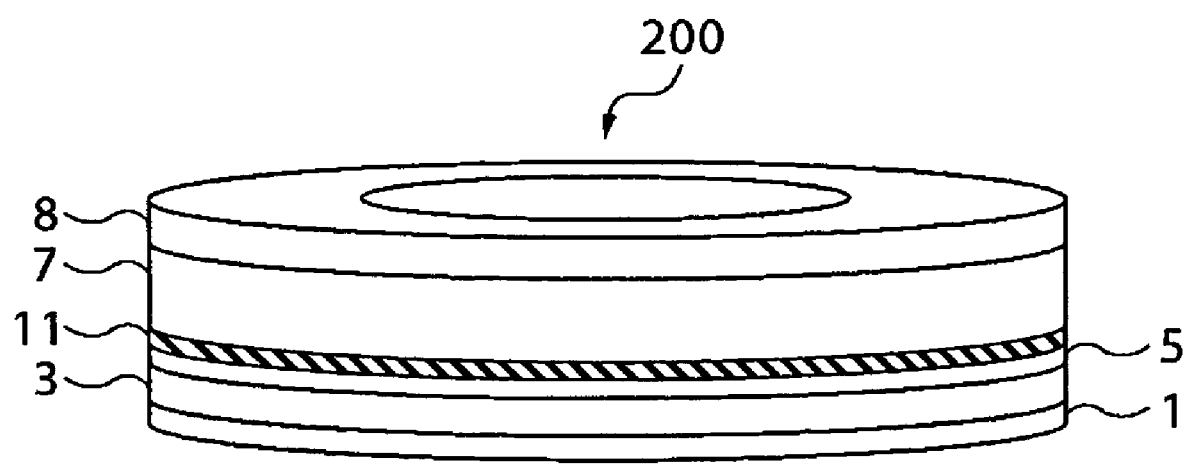
FIG. 4 illustrates an exemplary structure of an oscillatory-wave actuator according to a second exemplary embodiment of the present invention.

FIG. 4 illustrates an exemplary structure of an oscillatory-wave actuator according to the second exemplary embodiment.

In an oscillatory-wave actuator 200 shown in FIG. 4, the same reference numerals are used for components similar to those of the oscillatory-wave actuator 100, and description thereof will be omitted.

In FIG. 4, an insulator 11 insulates an elastic body 7 from an electrode 6 (not shown) provided for a piezoelectric 5.

Figure 5:
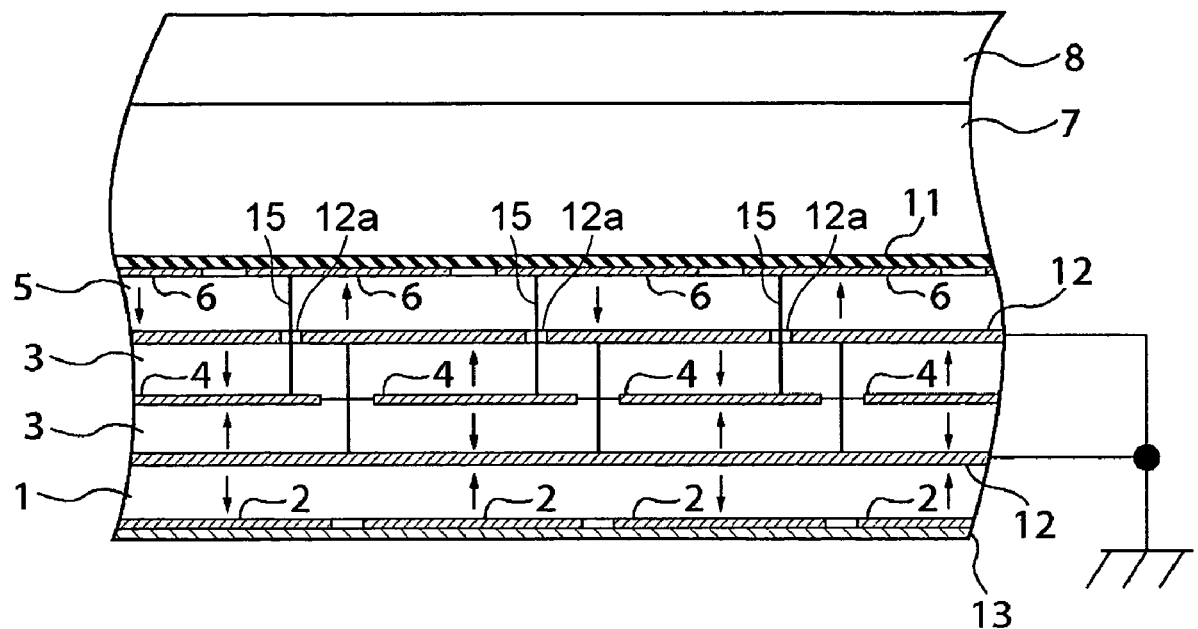
FIG. 5 is a cross-sectional view of part of the oscillatory-wave actuator shown in FIG. 4.

The oscillatory-wave actuator 100 shown in FIG. 1 is formed of cylindrical piezoelectrics and elastic bodies stacked on top of each other, and rotates the movable body 8 by synthesizing two different vibrations of push-up vibration and torsional vibration. In contrast, the oscillatory-wave actuator 200 shown in FIG. 4 is formed of a movable body 8 and a oscillating body including ring-shaped piezoelectrics 1, 3, and 5, the elastic body 7, and the insulator 11; and rotates the movable body 8 by forming a traveling oscillatory wave in the ring-shaped oscillating body by out-of-plane bending vibration. FIG. 5 is a cross-sectional view of part of the oscillatory-wave actuator 200 shown in FIG. 4.

Arrows in the drawing indicate polarization directions. An electrode 12 is disposed between the piezoelectric 1 and the piezoelectric 3, and another electrode 12 is disposed between the piezoelectric 3 and the piezoelectric 5. A feeding feature 13 feeds power to the electrode 2. The piezoelectric 3 includes two sections having the electrode 4 therebetween. The electrode 12 between the electrode 4 and the electrode 6 has a plurality of small through-holes 12a for avoiding connection with the electrode 4 or the electrode 6. Conductors 15 for electrically connecting the electrode 4 and the electrode 6 pass through the through-holes 12a without being in contact with the electrode 12.

Figure 6:
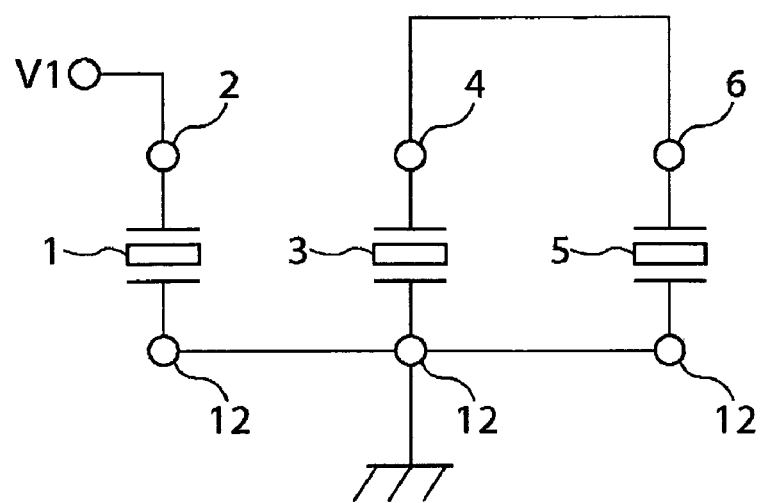
FIG. 6 illustrates an exemplary driving circuit of the oscillatory-wave actuator shown in FIG. 4.

The electrodes 2, 4, and 6 each include multiple electrode blocks, and a regular spacing is maintained between adjacent pairs of electrode blocks. Moreover, the polarities of the pairs of electrode blocks are reversed with respect to each other, i.e., when one of the electrode blocks is positive, the other electrode block is negative. FIG. 6 illustrates an exemplary driving circuit of the oscillatory-wave actuator 200 shown in FIG. 4.

The electrode 12 is connected to the ground potential. The electrode 4 disposed inside the piezoelectric 3 is connected to the electrode 6 of the piezoelectric 5 via the plurality of through-holes formed in the electrode 12. Exemplary operations of the oscillatory-wave actuator 200 will now be described with reference to FIGS. 5 and 6.

Polarization directions of the piezoelectric 1 with respect to the pairs of blocks of the electrode 2 are opposite to each other. When an AC voltage V1 is applied to the electrode 2 by the feeding feature 13, a standing wave having a half-wavelength equal to the width of an electrode block in the circumferential direction is formed in the ring-shaped oscillating body. Since the electrode blocks of the electrode 2 and the electrode 4 are disposed in the same pattern around the circumference and polarization directions of the pairs of electrode blocks are alternately reversed, a vibration-detecting voltage in response to the standing wave is output to the electrode blocks of the electrode 4.

Next, the vibration-detecting voltage is applied to the electrode blocks of the electrode 6 of the piezoelectric 5. The electrode blocks of the electrode 6 are disposed around the circumference so as to be shifted by a quarter wavelength of the standing wave with respect to the positions of the electrode blocks of the electrode 2 or the electrode 4.

Therefore, when the vibration-detecting voltage output from the electrode blocks of the electrode 4 is applied to the electrode blocks of the electrode 6, a standing wave is formed in an area shifted from that of the above-described standing wave. Since the electrode 4 and the electrode 6 are connected by the conductors 15, voltages having the same amplitude are generated in the electrode 4 and the electrode 6.

The voltages generated in the electrode 4 and the electrode 6 can be calculated from a voltage generated in only the piezoelectric 3 and a voltage generated in only the piezoelectric 5. For example, when capacitances of the piezoelectric 3 and the piezoelectric 5 are at a ratio of 2:1, the voltages generated in the electrode 4 and the electrode 6 are the sum of twice the output voltage of the piezoelectric 3 and the output voltage of the piezoelectric 5 divided by 3. Vibration generated in the ring-shaped oscillating body by the voltages generated in the electrode 4 and the electrode 6 will now be described.

First, when an AC voltage having a frequency higher than the resonant frequency of the ring-shaped oscillating body is applied to the electrode 2 of the piezoelectric 1, a standing wave is formed in the ring-shaped oscillating body. The phase of the standing wave is shifted from that of the AC voltage applied to the electrode 2 by 90° or more, and approaches 90° as the frequency of the AC voltage approaches the resonant frequency of the ring-shaped oscillating body.

Since the electrode blocks and the polarization patterns of the electrode 4 of the piezoelectric 3 are located at the same positions around the circumference as those of the piezoelectric 1, a vibration-detecting voltage in response to the standing wave is output to the electrode 4.

Since the electrode blocks and the polarization patterns of the electrode 6 of the piezoelectric 5 are located at positions shifted from those of the piezoelectric 1 by a quarter wavelength of the standing wave around the circumference, the voltage input to the electrode 6 that is connected to the electrode 4 is cancelled by positive and negative distortion, and thus the output in response to the standing wave is substantially 0 V. Therefore, the amplitude of the voltages of the electrode 4 and the electrode 6 generated by the connection of the electrode 4 and the electrode 6 are two thirds of the vibration-detecting voltage output from the piezoelectric 3 to the electrode 4, and the phases of the output voltages are the same as that of the vibration-detecting voltage.

In this manner, an AC voltage having a phase shifted from that of the AC voltage applied to the electrode 2 is applied to the piezoelectric 5 whose electrode blocks and polarization patterns are located at positions shifted from those of the piezoelectric 1 by a quarter wavelength of the standing wave. As a result, a second standing wave, which is different from the standing wave (referred to as "a first standing wave" hereafter) formed by the piezoelectric 1, is formed by the piezoelectric 5 in the ring-shaped oscillating body.

When superposition of the second standing wave that vibrates with a phase shifted from that of the first standing wave in terms of time on the first standing wave is started, components of the traveling wave start increasing in amplitude.

Since the piezoelectric 5, whose output voltage is 0 V at first, starts outputting the vibration-detecting voltage to the projecting blocks 6 in response to the second standing wave, the synthesized vibration-detecting voltages output to the electrode 4 and the electrode 6 become equal to the synthesized vibration-detecting voltage generated by the first and second standing waves. However, since the capacitance of the piezoelectric 3 is larger than that of the piezoelectric 5 as described above, the output of the electrode 4 is dominant.

When the capacitance of the piezoelectric 3 is increased by increasing the number of lamination layers of the piezoelectric 3, the voltages generated in the electrode 4 and the electrode 6 when the electrode 4 and the electrode 6 are connected are substantially equal to the voltage generated in the piezoelectric 3 alone.

Next, when the frequency of the AC voltage applied to the electrode 2 is equal to the resonant frequency of the ring-shaped oscillating body, the phase of the first standing wave is delayed by 90° in terms of time with respect to that of the AC voltage applied to the electrode 2. Also, the phase of the second standing wave is delayed by 90° in terms of time with respect to that of the voltage output from the piezoelectric 3 to the electrode 4 and that of the voltage input to the electrode 6 that is connected with the electrode 4.

At this time, the voltage output from the piezoelectric 3 to the electrode 4 is sufficiently large compared with the voltage output from the piezoelectric 5 to the electrode 6 when the capacitance of the piezoelectric 3 is increased by increasing the number of lamination layers of the piezoelectric 3 as described above, and the voltage output from the piezoelectric 3 to the electrode 4 and the voltage input to the electrode 6 that is connected with the electrode 4 are conceivably delayed by 90° in terms of time with respect to the AC voltage applied to the electrode 2. However, in practice, the phases of the voltages are delayed by more than 90° due to the influence of the vibration-detecting voltage in response to the second standing wave. However, the phases of the voltages are yet shifted by a considerable degree with respect to the AC voltage applied to the electrode 2, and therefore a certain level of traveling wave is eventually formed in the ring-shaped oscillating body. Thus, the movable body 8 is moved by this traveling wave.

As described in detail above, according to this exemplary embodiment, the AC voltage V1 is applied to the piezoelectric 1 such that the first standing wave is formed in the ring-shaped oscillating body (the piezoelectrics 1, 3, 5, and the elastic body 7). The piezoelectric 3 outputs the vibration-detecting voltage in response to this standing wave. Then, the piezoelectric 5 receives the vibration-detecting voltage and forms the second standing wave in the oscillating body. As a result, a traveling oscillating wave is formed in the elastic bodies by a single-phase driving voltage without requiring a driving circuit generating polyphase AC voltages, resulting in a simplified structure of the driving circuit.

Third Exemplary Embodiment

A third exemplary embodiment of the present invention will now be described.

Figure 7:
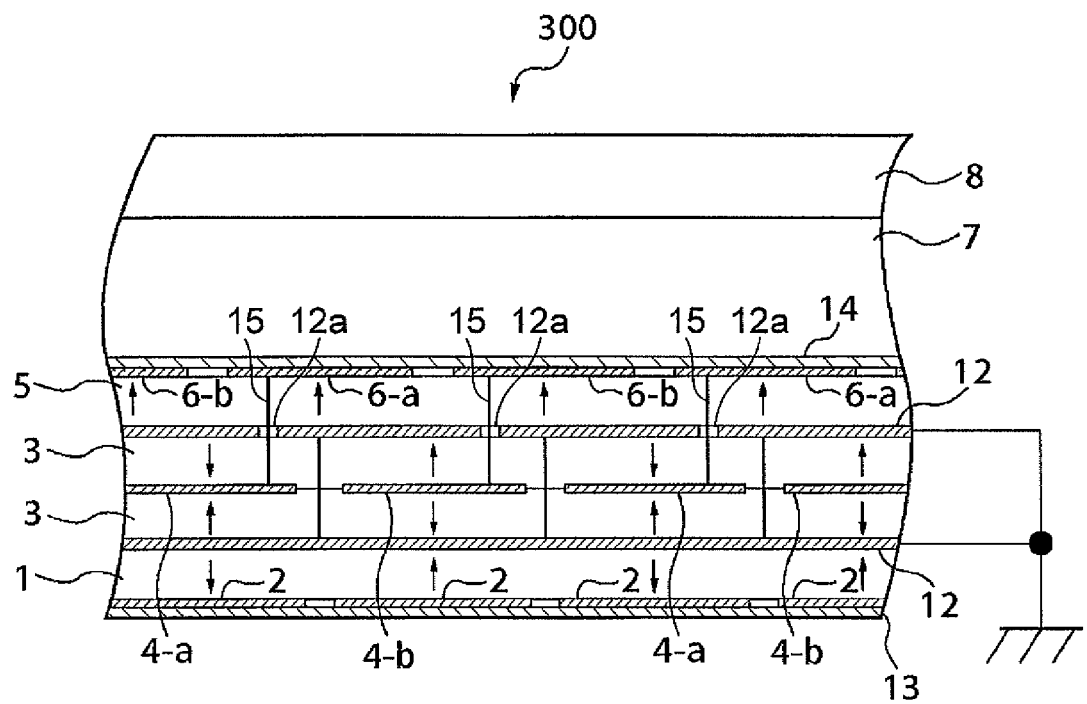
FIG. 7 is a cross-sectional view of part of an oscillatory-wave actuator according to a third exemplary embodiment of the present invention.
Figure 8:
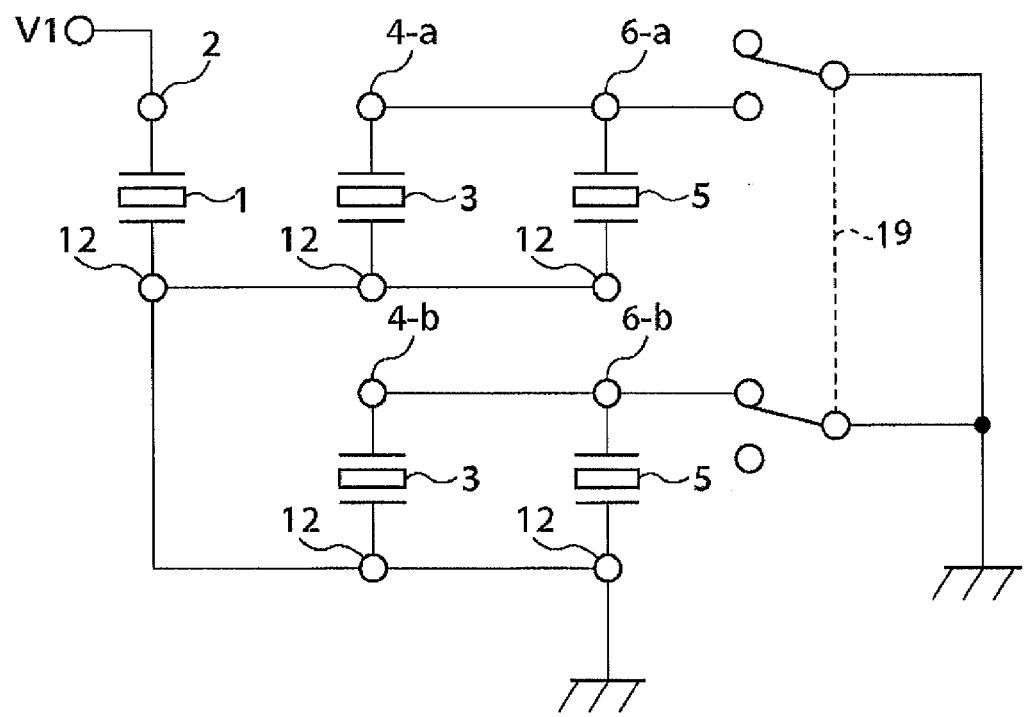
FIG. 8 illustrates an exemplary driving circuit of the oscillatory-wave actuator shown in FIG. 7.

In the second exemplary embodiment, only the electrode 4 and the electrode 6 are connected, and the moving direction of the movable body 8 cannot be switched. In this exemplary embodiment, the polarization directions of a piezoelectric 5 are changed such that the moving direction of a movable body 8 can be switched by adding a switch 19 (see FIG. 8). FIG. 7 is a cross-sectional view of part of an oscillatory-wave actuator 300 according to the third exemplary embodiment, and FIG. 8 illustrates an exemplary driving circuit of the oscillatory-wave actuator 300 shown in FIG. 7.

In the oscillatory-wave actuator 300 shown in FIG. 7, the same reference numerals are used for components which are similar as those of the oscillatory-wave actuator 200, and description thereof will be omitted.

According to the instant embodiment, the structure of the oscillatory-wave actuator 300 is basically the same as that of the oscillatory-wave actuator 200, but the polarization directions of the piezoelectric 5 are different. A piezoelectric 3 includes electrodes 4-$a$ and 4-$b$, and a piezoelectric 5 includes electrodes 6-$a$ and 6-$b$. The electrodes 4-$a$ are connected with the electrodes 6-$a$, and the electrodes 4-$b$ are connected with the electrodes 6-$b$. Hereafter, the electrodes 4-$a$ and the electrodes 6-$a$ are referred to as a group a, and the electrodes 4-$b$ and the electrodes 6-$b$ are referred to as a group b.

Wiring 14 insulates an elastic body 7 from the electrodes 6-$a$ and 6-$b$, and connects the switch 19 with either the group a or the group b. In the oscillatory-wave actuator 300, the moving direction of the movable body 8 is changed by switching the electrode groups to be connected with the ground potential between the group a and the group b by using the switch 19. The reasons the moving direction of the movable body 8 can be changed by switching the electrode groups to be connected with the ground potential between the group a and the group b will now be described.

Portions including the electrodes 4-$a$ and the electrodes 4-$b$ in the piezoelectric 3 are polarized in directions opposite to each other, but portions including the electrodes 6-$a$ and the electrodes 6-$b$ in the piezoelectric 5 are polarized in the same direction. Moreover, the length of the electrodes is substantially a half wavelength of a standing wave formed in the oscillating body. Therefore, when the piezoelectric 3 is distorted by the first standing wave, distortions having opposite signs are generated in the respective portions including the electrodes 4-$a$ and the electrodes 4-$b$.

Since the polarization directions are opposite in the portions including the electrodes 4-$a$ and the electrodes 4-$b$, vibration-detecting voltages that are substantially equal to each other are output to the electrodes 4-$a$ and the electrodes 4-$b$. Therefore, identical voltages are applied to the electrodes 6-$a$ and the electrodes 6-$b$ when the connection of the switch 19 is ignored. Since all the portions including the electrodes 6-$a$ and the electrodes 6-$b$ in the piezoelectric 5 are polarized in the same direction, vibrations generated by applying the identical AC voltages to the electrodes 6-$a$ and the electrodes 6-$b$ are cancelled with each other, and substantially no standing wave is formed.

However, in practice, one of the group a and the group b is connected with the ground potential by the switch 19, and a standing wave is formed. Therefore, the sign of the phase of the standing wave can be switched by using the switch 19. In this manner, the moving direction of the movable body 8 can be switched.

According to this exemplary embodiment, a similar effect as in the second exemplary embodiment can be produced. Moreover, the sign of the phase of the standing wave can be changed such that the moving direction of the movable body 8 is changed by switching the electrode groups to be connected with the ground potential between the group a and the group b by using the switch 19. Thus, the moving direction of the movable body 8 can be switched while the oscillatory-wave actuator 300 is operated by a single-phase driving voltage.

Moreover, according to the oscillatory-wave actuator in this exemplary embodiment, the phase difference between the first and second standing waves in terms of time is 90°, which is an optimum phase difference in a resonant condition.

In the first to third exemplary embodiments, one of the two standing waves is formed by the vibration-detecting voltage, but two or more standing waves can be formed when a polyphase drive is conducted.

Furthermore, phase-adjusting for adjusting the phase of the vibration-detecting voltage described in the first exemplary embodiment can also be used in the second and third exemplary embodiments such that the phase difference between the first and second standing waves can be adjusted. Thus, the oscillatory-wave actuator is applicable when the driving frequency of the AC voltage V1 is lower than the resonant frequency of the oscillating body or when a phase difference other than 90° as in a case of a three-phase drive and the like is required.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-161799 filed Jun. 1, 2005, which is hereby incorporated by reference herein in its entirety.

What is claimed is:

1. An oscillatory-wave actuator configured to form first and second standing waves having positions which are shifted according to their time of generation, wherein a traveling wave is formed by synthesis of the first and second standing waves, the actuator comprising:
    an elastic body configured to generate standing waves;
    a movable body in contact with the elastic body, wherein the movable body is driven according to the traveling wave;
    a first electromechanical transducer configured to form the first standing wave in response to a supplied voltage;
    a second electromechanical transducer configured to output a vibration-detecting voltage in response to vibration from the first standing wave; and
    a third electromechanical transducer configured to be supplied only with the vibration-detecting voltage and form the second standing wave in response to the vibration-detecting voltage.

2. The oscillatory-wave actuator according to claim 1, further comprising at least one of a resistance and an inductance disposed in series with or in parallel with the third electromechanical transducer.

3. The oscillatory-wave actuator according to claim 1, the vibration-detecting voltage comprising a plurality of vibration-detecting voltages;
    wherein the second electromechanical transducer outputs vibration-detecting voltages having different polarities.

4. The oscillatory-wave actuator according to claim 1, the vibration-detecting voltage comprising a plurality of vibration-detecting voltages;
    wherein vibration-detecting voltages having different polarities are input into the third electromechanical transducer.

5. A method for driving an oscillatory-wave actuator, the actuator including an elastic body in contact with a movable body, the actuator configured to form first and second standing waves having positions which are shifted according to their time of generation in the elastic body, the actuator further configured to drive the movable body according to a traveling wave formed by synthesis of first and second standing waves; the actuator further comprising first, second and third electromechanical transducers; the method comprising:
    supplying the first electromechanical transducer with voltage to form the first standing wave;
    outputting a vibration-detecting voltage from the second electromechanical transducer in response to vibration from the first standing wave; and
    supplying only the third electromechanical transducer with the vibration-detecting voltage to form the second standing wave in response to the vibration-detecting voltage.

* * * * *